US010036962B2

(12) United States Patent
Quintanilha (10) Patent No.: US 10,036,962 B2
(45) Date of Patent: Jul. 31, 2018

(54) INSPECTION APPARATUS AND METHODS, LITHOGRAPHIC SYSTEM AND DEVICE MANUFACTURING METHOD (71) Applicant: ASML Netherlands B.V., Veldhoven (NL)

(72) Inventor: Richard Quintanilha, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/103,629

(22) PCT Filed: Nov. 20, 2014

(86) PCT No.: PCT/EP2014/075170
§ 371 (c)(1),
(2) Date: Jun. 10, 2016

(87) PCT Pub. No.: WO2015/086285
PCT Pub. Date: Jun. 18, 2015

(65) Prior Publication Data
US 2016/0320711 A1    Nov. 3, 2016

(30) Foreign Application Priority Data
Dec. 13, 2013 (EP) .................................... 13197291

(51) Int. Cl.
*G03B 27/32* (2006.01)
*G03F 7/20* (2006.01)
(Continued)

(52) U.S. Cl.
CPC .......... *G03F 7/70516* (2013.01); *G01B 11/06* (2013.01); *G01B 11/14* (2013.01); *G03F 7/70625* (2013.01)

(58) Field of Classification Search
CPC ..... G01B 11/06; G01B 11/14; G03F 7/70516; G03F 7/70625
(Continued)

(56) References Cited

U.S. PATENT DOCUMENTS 6,850,333 B1    2/2005  Johnson et al.
7,993,813 B2    8/2011  Scott et al.
(Continued)

FOREIGN PATENT DOCUMENTS

EP           1372040        12/2003
KR     1020120080198 A       7/2012
(Continued)

OTHER PUBLICATIONS

International Search Report and Written Opinion of the International Searching Authority directed to related International Patent Application No. PCT/EP2014/075170, dated Apr. 13, 2015; 10 pages.
(Continued)

Primary Examiner — Peter B Kim
(74) Attorney, Agent, or Firm — Sterne, Kessler, Goldstein & Fox P.L.L.C.

(57) ABSTRACT

A scatterometer is used to measure a property of structures on a substrate. A target grating comprises lines arranged periodically over an distance $g_p$ in a first direction, each line individually extending a distance gL in a second direction. The grating is illuminated with a spot of radiation and diffracted radiation is detected and used to calculate a measurement of CD, side wall angle and the like. The spot defines a field of view customized to the grating such that an extent $f_P$ of the spot in said first direction is greater than distance $g_p$ while an extent $f_L$ of the spot in said second direction is less than distance $g_L$. The grating may be smaller than conventional gratings. The calculation can be simpli-
(Continued)

fied and made more robust, using a mathematical model that assumes that the grating is finite in the first direction but infinite in the second direction.

19 Claims, 5 Drawing Sheets (51) Int. Cl.
*G01B 11/06* (2006.01)
*G01B 11/14* (2006.01)

(58) Field of Classification Search
USPC .................................................... 355/67, 55
See application file for complete search history.

(56) References Cited

U.S. PATENT DOCUMENTS

| | | |
|---|---|---|
| 8,390,823 B2 | 3/2013 | Cramer et al. |
| 2005/0106480 A1 | 5/2005 | Suwa |
| 2006/0033921 A1 | 2/2006 | Den Boef et al. |
| 2009/0279090 A1* | 11/2009 | Wolf ...................... G01B 11/24 356/369 |
| 2010/0201963 A1 | 8/2010 | Cramer et al. |
| 2011/0229830 A1 | 9/2011 | Bhattacharyya et al. |
| 2012/0044470 A1 | 2/2012 | Smilde et al. |
| 2012/0123581 A1* | 5/2012 | Smilde ................ G03F 7/70483 700/105 |
| 2012/0123748 A1 | 5/2012 | Aben et al. |
| 2012/0242970 A1 | 9/2012 | Smilde et al. |
| 2013/0035911 A1 | 2/2013 | Pisarenco et al. |
| 2013/0144560 A1 | 6/2013 | Pisarenco et al. |

FOREIGN PATENT DOCUMENTS

| | | |
|---|---|---|
| TW | 201229496 A1 | 7/2012 |
| TW | 201232060 A1 | 8/2012 |
| WO | WO 2009/078708 | 6/2009 |
| WO | WO 2009/106279 | 9/2009 |

OTHER PUBLICATIONS

International Preliminary Report on Patentability directed to related International Patent Application No. PCT/EP2014/075170, dated Jun. 7, 2016; 6 pages.
Ku, et al. "Performance study of CD mark size for angular scatterometry," *Metrology, Inspection, and Process Control for Microlithography XIX*, SPIE 5752:59-61 (2005); 8 pages.
Korean Written Decision on Registration with English-language Translation attached from related Korean Patent Publication No. KR 20160089503 A, dated May 11, 2018; 2 pages.

* cited by examiner

Fig. 9

INSPECTION APPARATUS AND METHODS, LITHOGRAPHIC SYSTEM AND DEVICE MANUFACTURING METHOD

CROSS-REFERENCE TO RELATED APPLICATIONS

This application claims the benefit of EP application 13197291, which was filed on Dec. 13, 2013 and which is incorporated herein in its entirety by reference.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined Determination of the property of interest may be performed by various techniques: e.g., reconstruction of the target structure by iterative approaches such as rigorous coupled wave analysis or finite element methods; library searches; and principal component analysis.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). The spot defines effectively the field of view (FOV) of the scatterometer, while underfilling the grating simplifies mathematical reconstruction of the target as it can effectively be regarded as infinite. The cost of "real estate" occupied by such large targets is a major problem, however. It would be useful to include more metrology targets across a substrate. It would be particularly interesting to reduce the size of the targets, e.g., to 10 µm by 10 µm or less, for example 5 µm by 5 µm, so they can be positioned in amongst product features, rather than in the scribe lane. Metrology for overlay has been proposed in which the grating is made smaller than the measurement spot (i.e., the grating is overfilled). Detection of the diffraction orders in the form of dark field images enables overlay measurements to be made on smaller targets. Examples of dark field metrology can be found in international patent applications WO 2009/078708 and WO 2009/106279.

While detection using dark field imaging allows useful measurements of overlay to be made on small, overfilled targets, it does not provide suitable signals for other types of metrology. Moreover, the overlay measurements depend to a large extent on the assumption that all parameters except overlay are unchanged. Reconstruction of the target structure to determine parameters such as critical dimension (CD), side wall angle (SWA) or height, still requires large targets, which are underfilled by the illumination spot (field of view). Patent application US 2012/0123748A1 describes such a reconstruction process in more detail. In U.S. Pat. No. 6,850,333, it is proposed to form an illumination spot that is elongated. This spot is used to illuminate as many lines as possible in the direction of periodicity of the grating, without overfilling it in the direction of the lines (the direction transverse to periodicity). Nevertheless the requirement for underfilling the grating limits the extent to which it can be shrunk. To reduce the size of the illumination spot so as to allow the grating to be smaller brings a reduction in the amount of radiation that can be captured in a given time, leading to slowness in the measurement process, and/or a loss of accuracy.

SUMMARY OF THE INVENTION

It is desirable to provide a technique for metrology which.

The invention in a first aspect provides a method of measuring a property of structures on a substrate, said method comprising the steps:

(a) providing a substrate with a grating in which a plurality of structures are arranged periodically over an distance $g_P$ in a first direction, each structure individually extending a distance $g_L$ in a second direction transverse to the first direction, (b) illuminating said structure with a spot of radiation having a defined size and shape such that an extent $f_P$ of the spot in said first direction is greater than distance $g_P$ while an extent $f_L$ of the spot in said second direction is less than distance $g_L$;

(c) detecting a signal arising from interaction between said radiation and said structure within a field of view defined by said spot; and (d) calculating a measurement of said property based on the detected signal.

In some embodiments of the invention, the grating is elongated such that $g_L$ is two or more times $g_P$, or three or more times $g_P$. The grating may be smaller than conventional gratings such that $g_P$ is less than 8 µm, less than 6 µm or less than 4 µm, for example.

In some embodiments, the field of view is elongated, such that $f_P$ is two or more times $f_L$, or three or more times $f_L$. The field of view may be smaller in at least one direction that conventional illumination spots, such that $f_L$ is less than 6 µm, less than 4 µm or less than 3 µm, for example.

In some embodiments, the size and shape of said spot are defined by an adjustable field stop in an illumination optical system. In contrast, the U.S. Pat. No. '333 mentioned above proposes only to limit an illumination pupil to shape the illumination spot.

The step (d) of the method may comprise for example:

(d1) defining a mathematical model in which shape and material properties of said structure, are represented by a plurality of parameters including at least one parameter of interest;

(d2) calculating a plurality of model signals by simulating interaction between said radiation and said mathematical model while varying the parameter or parameters of interest;

(d3) calculating degrees of matching between the detected signal and at least some of the model signals calculated in step (d2); and (d4) reporting a measurement of said parameter of interest based on the calculated degrees of matching.

Computation of the model signals can be simplified thanks to the relationships between the grating and the illumination spot. For example, said model signals can be calculated with regard to two dimensions only, with the assumption that the structure in the second direction is infinite. In some embodiments, the steps (d2) and (d3) are performed in an iterative loop to find a value of the parameter of interest by regression.

The invention in a further aspect provides an inspection apparatus for measuring a property of structures on a substrate, the apparatus comprising:

a support for a substrate having a target structure formed thereon;

an optical system for illuminating the target structure with a spot of radiation and detecting a signal arising from interaction between said radiation and said target structure;

a processor arranged to calculate a measurement of said property based on said detected signal, wherein said processor is arrange to calculate said measurement on the assumption that said target structure comprises a grating in which a plurality of structures are arranged periodically over an distance $g_P$ in a first direction, each structure individually extending a distance $g_L$ in a second direction transverse to the first direction, and wherein said optical system is operable to illuminate define the shape and size of said spot of radiation such that an extent $f_P$ of the spot in said first direction is greater than distance $g_P$ while an extent $f_L$ of the spot in said second direction is less than distance $g_L$.

Features of the apparatus can be adapted to perform the embodiments of the method set forth above.

In some embodiments, the apparatus is arranged automatically to repeat said illumination, detection and calculation for a plurality of gratings on the same substrate, and wherein the orientation of the first and second directions is different for different ones of said gratings. The apparatus may also be operable to use the size and shape of spot for gratings of different orientations.

The invention in the fourth aspect further provides a computer program product comprising machine-readable instructions for causing a processor to perform the step (d) of a method as set forth above.

The computer program product may further comprise instructions for causing a processor to control an inspection apparatus to perform the steps (b) and (c) of the method for a plurality of gratings.

The invention yet further provides a lithographic system comprising:

a lithographic apparatus arranged to transfer a sequence of patterns from patterning devices onto a substrate in an overlying manner; and an inspection apparatus according to any of the aspects of the invention as set forth above.

The lithographic system may be arranged to control the lithographic apparatus to apply corrections in response to measurements made using the inspection apparatus on a previous substrate.

The invention yet further provides a method of manufacturing devices wherein a sequence of device patterns is applied to a series of substrates using a lithographic process, the method including measuring a property of metrology gratings formed as part of or beside said device patterns on at least one of said substrates using a measuring method according to the invention as set forth above, wherein the lithographic process for one or more substrates is controlled in response to the property measured on one or more previous substrates.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
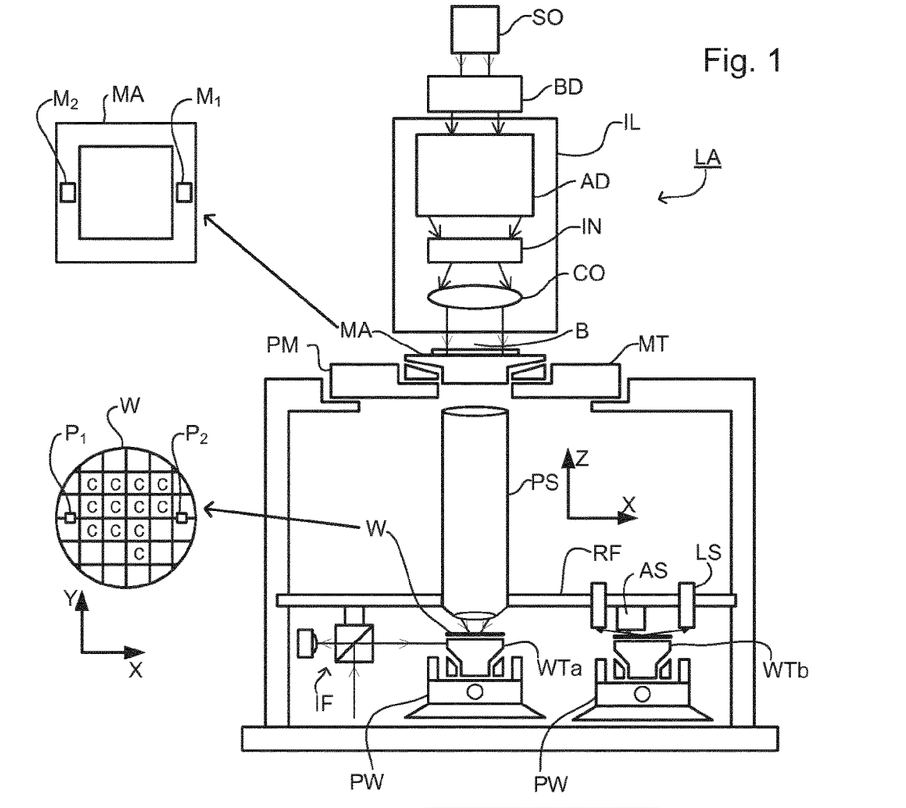
FIG. 1 depicts a lithographic apparatus according to an embodiment of the invention.

FIG. 1 schematically depicts a lithographic apparatus LA. The apparatus includes an illumination system (illuminator)

IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS.

Figure 2:
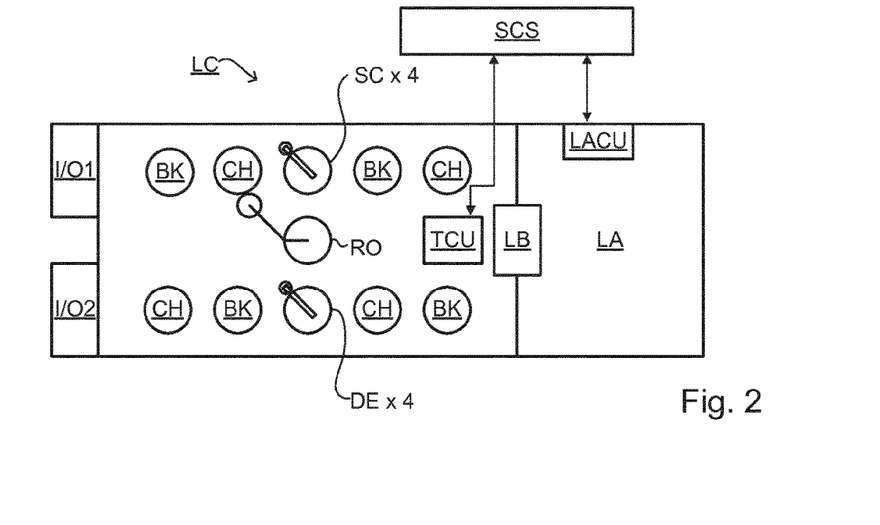
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3:
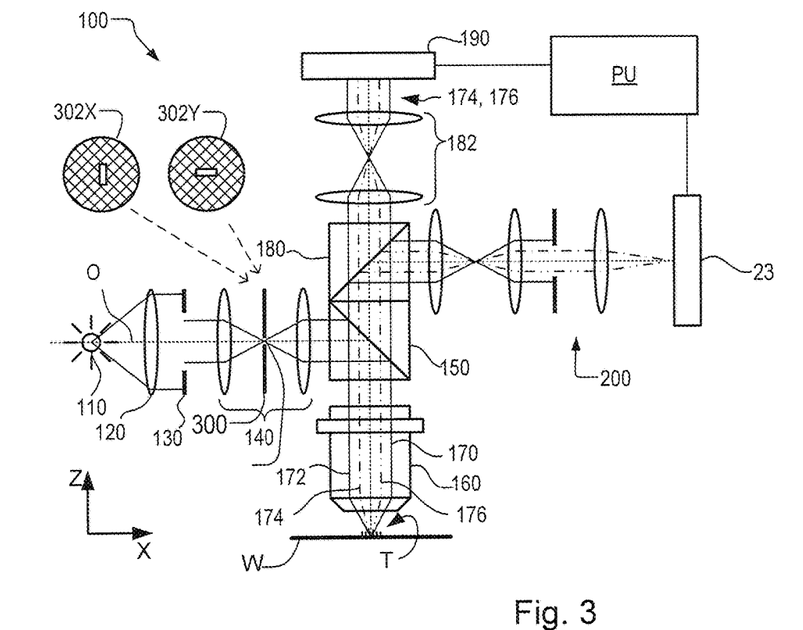
FIG. 3 comprises a schematic diagram of a scatterometer forming an inspection apparatus according to one embodiment of the present invention.

FIG. 3 illustrates an example of an inspection apparatus 100 suitable for use in embodiments of the invention disclosed herein. In this example, the apparatus is a scatterometer adapted for performing angle-resolved scatterometry, among other functions. The principles of operation of the scatterometer are explained in more detail in the prior patent applications US2006033921A1 and US2010201963A1, mentioned above. The scatterometer may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 110 (e.g., a xenon lamp) is directed onto substrate W via by an optical system comprising: lens 120, aperture plate 130, lens system 140, a beam splitter 150 and objective lens 160. These lenses 120, 140, 160 are arranged in a double sequence of a 4F arrangement. A different lens arrangement can be used, if desired. The angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 130 of suitable form between lenses 120 and 140, in a plane which is a back-projected image of the objective lens pupil plane. Different modes of illumination are possible by using different apertures. The rest of the pupil plane is desirably dark as any unnecessary light outside the desired illumination mode will interfere with the desired measurement signals. The angular distribution of illumination in radial and circumferential directions, as well as properties such as wavelength, polarization and coherency of the radiation, can all be adjusted to obtain desired results. These concepts are familiar to the skilled reader and will not be described in more detail herein.

As shown in FIG. 3, grating target T is placed with substrate W normal to the optical axis O of objective lens 160. Rays of illumination 170, 172 are focused to an illumination spot impinging on target T from angles off the axis O gives rise to diffracted rays 174, 176. It should be remembered that with an overfilled small target grating, these rays are just one of many parallel rays covering the area of the substrate including metrology target T and other features. Each element within the illumination spot is within the field of view of the scatterometer. Since the aperture in plate 130 has a finite width (necessary to admit a useful quantity of light), the incident rays 170, 172 will in fact occupy a range of angles, and the diffracted rays 174, 176 will be spread out somewhat. According to the point spread function of a small target, each diffraction order will be further spread over a range of angles, not a single ideal ray as shown.

At least the 0 and +1 orders diffracted by the target on substrate W are collected by objective lens 160 and directed back through beam splitter 150. A second beam splitter 180 divides the diffracted beams into two measurement branches. In a first measurement branch, optical system 182 forms a diffraction spectrum (pupil plane image) of the target on first sensor 190 (e.g. a CCD or CMOS sensor) using the zeroth and first order diffractive beams. Each diffraction order hits a different point on the sensor, so that image processing can compare and contrast orders. The apparatus can be can also be used for many measurement purposes such as dark field imaging, which are not the subject of the present disclosure. For example, a second measurement branch 200 is provided to form an image of the target on the substrate W on a second sensor 23 (e.g. a CCD or CMOS sensor). The second management branch can be used for various auxiliary functions such as focusing the scatterometer, and for dark field imaging of the type mentioned in the introduction.

Figure 6:
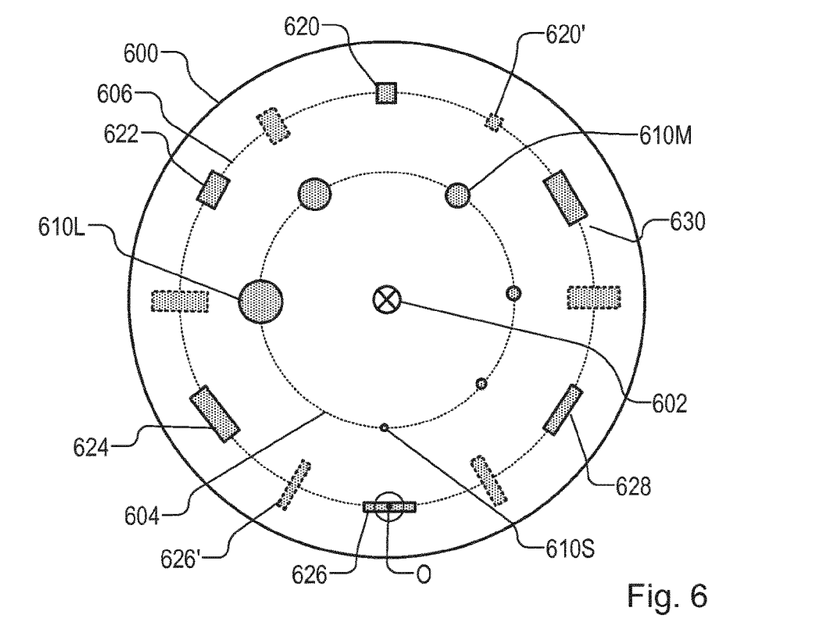
FIG. 6 shows schematically an aperture wheel permitting selection of custom illumination spot dimensions in the scatterometer of FIG. 3.

In order to provide a customized field of view for different sizes and shapes of grating, an adjustable field stop 300 is provided within the lens system 140 on the path from source 110 to the objective. The field stop 300 contains an aperture 302 and is located in a plane conjugate with the plane of the target T, so that the illumination spot becomes an image of the aperture 302. The image may be scaled according to a magnification factor, or the aperture and illumination spot may be in 1:1 size relation. In order to make the illumination adaptable to these different types of measurement, the aperture plate 300 may comprise a number of aperture patterns formed around a disc, which rotates to bring a desired pattern into place. A simple example of this is illustrated in FIG. 6, described below. Alternatively or in addition, a set of plates 300 could be provided and swapped, to achieve the same effect. A programmable aperture device such as a deformable mirror array or transmissive spatial light modulator can be used also.

Axes X and Z are shown in FIG. 3. Axis Y lead into the page. Typically, a target grating will be aligned with its grating lines running either parallel to the Y axis or parallel to the X axis. With regard to its diffractive behavior, the grating with lines running parallel to the Y axis has periodicity in the X direction, while the grating with lines running parallel to the X axis has periodicity in the Y direction. In order to measure the performance of a lithographic process in both directions, both types of grating are generally provided. or periodic the Y direction of the substrate W. While we shall refer for simplicity to grating lines, in practice, each line and/or space between lines may be a structure formed of smaller sub-structures. The grating may be formed with periodicity in two dimensions at once, for example where the modeled structures are posts or via holes. These variations are well-known to the person skilled in the art.

For the purposes of the present invention, the aperture 302 may be elongated, and provided in two versions, as illustrated at 302X and 302Y, so that the longer axis of the illumination spot (field of view) can be oriented in a desired way with respect to the direction of periodicity of the grating.

Figure 4:
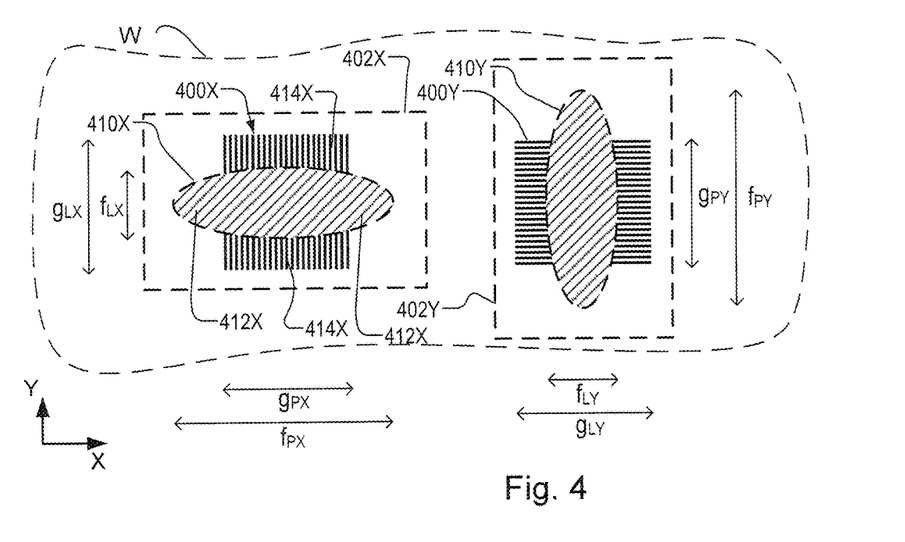
FIG. 4 depicts target gratings on a substrate and an outline of a measurement spot on each target grating a substrate in operation of the apparatus of FIG. 3, the relative dimensions of the illumination spot and target being set according to an embodiment of the invention.

FIG. 4 illustrates the principles of the customized design of illumination spot (field of view) and target grating in a first embodiment. The targets are shown, one having periodicity in the X direction and the other having periodicity in the Y direction. The X-direction grating will be described using reference signs having the suffix X. The Y-direction grating has corresponding features with suffix Y. Dimensions and other characteristics of the X- and Y-direction gratings are identical in this illustration. However, in general they may be different. Furthermore, gratings having different dimensions may be provided on the same substrate. Illumination spots having different dimensions may be used to illuminate the same grating, as well as different gratings.

The target grating 400X comprises a number of grating lines that is to say linear structures that are formed by the lithographic apparatus LA and extend in a direction parallel to the Y axis as shown. Dimensions of the grating 400XR marked and labelled as $g_{PX}$ in the direction of periodicity (first direction) and $g_{LX}$ in the direction parallel to the lines (second direction). Around the grating, a boundary 402X defines an exclusion area. Within this exclusion area, product features that could interfere with the measurement of grating properties are not allowed. The illumination spot 410X is shown, which in this example has an elongated form. The illumination spot may be rectangular in form, or elliptical/oval as shown. As mentioned already, the size and shape of illumination spot 410X effectively defines the field of view (FOV) of the scatterometer. Dimension $f_{PX}$ is the dimension of the field of view in the direction of periodicity of the grating, and dimension $f_{LX}$ is the dimension of the field of view in the direction of the grating lines, transverse to the direction of periodicity.

It will be seen that the design of the grating 400X and the field of view 410X has been done such that the field of view is longer than the grating in the direction of periodicity ($f_{PX}>g_{PX}$), while the dimension of the field of view is less than that of the grating in the direction parallel to the grating lines ($f_{LX}<g_{LX}$). Consequently, the field of view defined by illumination spot 410X includes portions 412X of the substrate that extend beyond the grating in the direction of periodicity. Conversely, the grating lines have portions 414X that extend well beyond the field of view in the direction parallel to the lines.

Referring to the Y-direction grating 400Y, the field of view defined by illumination spot 410Y is designed to have the same relationship as just described for the X-direction grating. Dimensions are marked showing that the field of view is longer than the grating in the direction of periodicity ($f_{PY}>g_{PY}$) and less than the dimension of the grating in the direction of the lines ($f_{LY}<g_{LY}$). In general therefore, the design is such that $f_P>g_P$ and $f_L<g_L$, regardless of the orientation of the grating. Many different combinations of gratings and illumination spots can be arranged to satisfy these two criteria. We refer to these generally as having the "customized field of view" that is the subject of the present disclosure.

Reconstruction Process Using Customized Field of View

A detailed description of pattern reconstruction processes such as 'regression based' and 'library based' methods, as well as a description of different types of scatterometers, can be found in US 2012/0123748A1. The present document describes the use of the scatterometer with customized field of view in a 'regression based' reconstruction process. The customized field of view may be used in other reconstruction models such as 'library based' processes and hybrids of regression and library processes. The customized field of view can be applied in different reconstruction processes, as desired.

Figure 5:
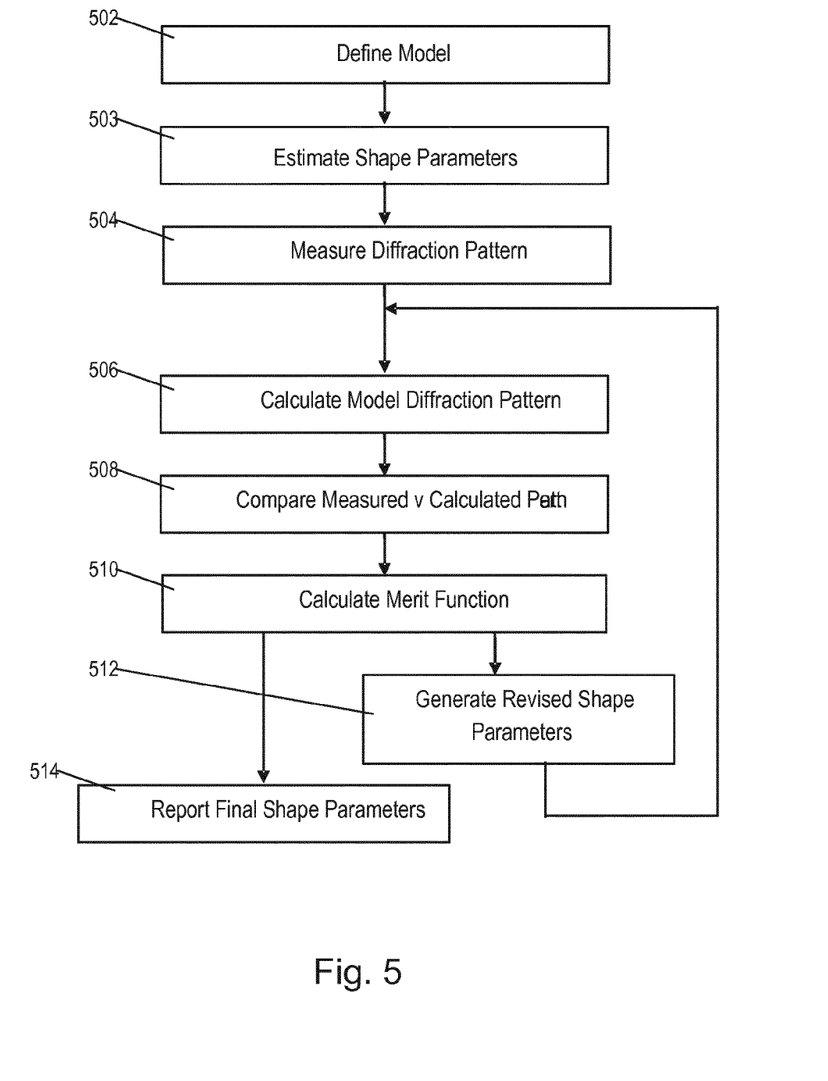
FIG. 5 depicts an example process for reconstruction of a structure from signals detected using the apparatus and target gratings of FIGS. 3 and 4.

FIG. 5 illustrates a 'regression based' process for reconstruction of a target using a parameterized model and diffraction patterns (diffraction spectra) detected using an inspection apparatus such as a scatterometer. In this type of reconstruction process, a diffraction pattern based on a first estimate of the target shape (a first candidate structure) is calculated and compared with the measured diffraction pattern. The calculation simulates the interaction between radiation and the structure described by the model. Parameters of the model are then varied systematically and the diffraction pattern re-calculated in a series of iterations, to generate new candidate structures and so arrive at a best fit. The target will be assumed for this description to be a structure periodic in one direction, as described with reference to FIG. 3, for example. In practice it may be periodic in two (or more) directions, and the processing will be adapted accordingly. The diffraction pattern may be for example a 2-D pupil image detected by sensor 190 in the scatterometer of FIG. 3.

In the terminology of the introduction and claims, the diffraction pattern measured by the scatterometer is an example of a detected signal. The diffraction patterns calculated using the parameterized model are examples of model signals. The steps of the method in more detail are as follows:

502: A 'reconstruction model' is established which defines a parameterized model of the target structure in terms of a number of parameters $P_i$ ($P_1$, $P_2$, $P_3$ and so on). These parameters may represent for example, in a 1-D periodic structure, the angle of a side wall, the height or depth of a feature, the width of the feature. Material properties of the target and underlying layers are also represented by parameters such as refractive index (at a particular wavelength present in the scatterometry radiation beam). Importantly, while a target structure may be defined by dozens of parameters describing its shape and material properties, the reconstruction model will define many of these to have fixed values, while others are to be variable or 'floating' parameters for the purpose of the following process steps. In the prior publication US 2012/0123748A1 a process is described by which the choice between fixed and floating parameters is made. The set of choices can be referred to as a 'recipe' for the reconstruction process, and different recipes can be tried. For example, the prior publication introduces ways in which parameters can be permitted to vary without being fully independent floating parameters. These techniques can be adopted or not, in implementing the present invention. For the purposes of describing FIG. 5, only the floating parameters are considered as parameters pi.

503: A model target shape is estimated by setting initial values $P_i^{(0)}$ for the floating parameters (i.e. $P_1^{(0)}$, $P_2^{(0)}$, $P_3^{(0)}$ and so on). Each floating parameter will be generated within certain predetermined ranges, as defined in the recipe.

504: The diffraction pattern of the actual target on the substrate is measured using the scatterometer and using the customized field of view shown in FIG. 4. This measured diffraction pattern is forwarded to a calculation system such as a computer. The calculation system may be the processing unit PU referred to above, or it may be a separate apparatus.

506: The parameters representing the estimated shape of the target, together with material properties of the different elements of the modeled target, are used to calculate the scattering behavior. This may be done for example using a rigorous optical diffraction method such as RCWA or other solver of Maxwell's equations of electromagnetism (referred to as an EM solver). As explained further below, when using the customized field of view that is the subject of the present application, particular solvers can be adopted that are suited to finite gratings. This gives the model diffraction pattern for the estimated target shape.

508, 510: The measured diffraction pattern and the model diffraction pattern are then compared and their similarities and differences are used to calculate a "merit function" for the model target shape.

512: Assuming that the merit function indicates that the model needs to be improved before it represents accurately the actual target shape, new parameters $P_1^{(1)}$, $P_2^{(1)}$, $P_3^{(1)}$, etc. are estimated and fed back iteratively into step 506. Steps 506-512 are repeated, so as to search for the set of parameter values that best describes the measured target. In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

514: When the merit function indicates that this iterative process has converged on a solution with a desired accuracy, the currently estimated parameters are reported as the measurement of the actual target structure.

The steps of the above process have been presented in a certain order for the sake of explanation. They do not have to be performed in the order described. For example, steps 502 and/or 503 can be performed after making a measurement in step 504. The computation time of this iterative process is largely determined by the forward diffraction model used, i.e. the calculation of the estimated model diffraction pattern using a rigorous optical diffraction theory from the estimated target structure. If more floating parameters are required, then there are more degrees of freedom. The calculation time increases with the number of degrees of freedom. The estimated or model diffraction pattern calculated at 506 can be expressed in various forms. For example, a modeled diffraction spectrum can be compared easily with a diffraction spectrum measured by the scatterometer apparatus of FIG. 3, when the model includes the optical behavior of the apparatus, from illumination source 110 to detector 190, as well as the scattering behavior of the target under inspection. This becomes an important consideration when many targets are to be measured on every substrate.

Throughout this description from FIG. 5 onward, the term 'diffraction pattern' will be used as an example of a detected signal on the assumption that an angularly resolved scatterometer is used, as described in the example apparatus of FIG. 3 and in the prior publication US 2012/0123748A1, mentioned above. The skilled person can readily adapt the teaching to different types of scatterometer, or even other types of measurement instrument.

In summary, the process of FIG. 5 uses a model fit approach to infer parameters of a target structure from a scatterometry measurement signal. While the concept is simple in principle, in practice it is difficult to design the reconstruction model. The model should be optimized to achieve an optimal measurement response to actual variations of the parameters of interest, while being insensitive to the influence of noise, calibration errors, model approximations and variation of other parameters. Finally, the model runtime should be minimized. While approaches to these issues have been devised and improve continually, there is currently no solution to measure accurately targets that are smaller than the FOV of the inspection apparatus. Where a target is overfilled, the information from the finiteness of the target, as well as its surroundings contributes to the detected signal and introduces a bias in the reconstructed measurements. Reducing the FOV can be tried but the amount of light available reduces correspondingly. Different light sources and other methods are investigated but all suffer from the finiteness of the target. That is to say, even if the spot is small enough to underfill the target, because of edge diffraction the real extent of the illumination spot is larger and the finiteness of the target is still a significant influence in the detected diffraction pattern.

A target smaller than the FOV may be referred to in modeling terms as an "isolated" target, whereas a target larger than the FOV (underfilled) can be regarded as infinite. To reconstruct 3-D isolated targets from detected signals requires software development and inevitably has a slower reconstruction process. 3-D EM solvers are demanding in terms of processing time and/or memory. The inventor has recognized that an alternative solution to the problem of reducing target size is to create customized combinations of target that can be smaller than the field of view in one direction, but larger than the field of view in the other direction. By appropriate choice of these dimensions, effects of finiteness can be minimized or eliminated. Moreover, additional information can be exploited to improve robustness of the measurements against variation in parameters other than the parameters of interest. Additionally, using knowledge of the customized design, the EM solver used in step 506 of the reconstruction model can be simplified, reducing computational burden.

The goal of the design in the embodiments presented here is to illuminate the target (lines grating) in a way that the following assumptions can be made in the model:

The grating lines are infinite along the direction transverse to the direction of periodicity; and The grating itself is finite (isolated) in the direction of periodicity.

This can be achieved by choosing the proper FOV in relation to the grating dimensions and orientation, as shown in FIG. 4. For instance a rectangular FOV shape (placing such an aperture shape in the field stop 300 of the instrument) will make the FOV see a two-dimensional isolated target (dimensions X, Z; infinite in Y). The scattering analysis in step 506 can be simplified greatly by making a 3-D isolated structure into a 2-D isolated structure which is much simpler to simulate, and suitable solvers such as RCWA are already available. A solver with particular suitability for finite gratings is disclosed by Pisarenco and Setija in US 20130035911 A1. Note that the term 1-D may be used in literature, referring to the grating that is modelled in the X (or Y) direction, but not both. When referring to "1-D" gratings the second dimension which is Z is taken as implicit.

It is further expected that for the 2-D isolated grating the reconstruction problem is better conditioned (more robust against unknown variables) than for a 2-D infinite grating. This is believed due to the diffused field contribution from portions of the field of view that are beyond the grating (412X in FIG. 4). These can help in extracting the geometrical parameters of the scattering structures from other influences in the materials and geometry of the underlying stack.

At the same time as the simulation can be made more accurate and/or the processing can be simplified, the overall dimensions of the targets can be reduced. As an example of dimensions, making the target smaller in one direction which can lead to a shape of for instance 2.5×10 µm. Using the customized FOV this target can occupy the same area as a 5×5 µm square grating, yet provide improved accuracy and/or simplified processing. Note that in this example, the shorter dimension is in the direction of periodicity ($g_P < g_L$), which is opposite to the shape illustrated in the U.S. Pat. No. 6,850,333, mentioned in the introduction.

FIG. 6 shows an aperture wheel 600, that can be used as the field stop 300 in the apparatus of FIG. 3. The aperture wheel is in the form of a thin plate that can be mounted in various orientations and positions in the appropriate plane within in the lens system 140, such that different individual apertures can be located on the optical axis, as desired. In this simple example, a rotational axis of the aperture wheel is shown at 602. Individual apertures are formed at various locations, arranged for example on a first ring 604 and a second ring 606. By moving the axis 602 towards or away from the optical axis O of the scatterometer, a selected aperture on either ring can be brought to use. On the inner ring 604, a variety of circular apertures are provided, labelled 610S (smallest) 610L (largest) and 610M (intermediate size). In a real example, many more intermediate sizes may be provided than are shown here. The diameters of the circular apertures may be designed to give a spot (field of view) ranging for example from 1 µm to 8 µm in diameter. There is in this example a de-magnification in the illumination optical system, so that the circular aperture defines a field of view that is a circular spot of smaller diameter than the physical aperture. For example, with a magnification of 0.015, one can use an aperture of diameter 200 µm (0.2 mm) to obtain a field of view of diameter 3 µm. Use of an aperture that is many times larger than the wavelength of the radiation avoids diffraction effects in the aperture, and of course makes the aperture plate easier to manufacture.

On the outer ring 606, a number of rectangular apertures are defined, labelled 620 to 630. 620 is a small square aperture, while the other apertures have different degrees of elongation. For the sake of example, the longest, narrowest aperture 626 is shown aligned with the optical axis O. In a practical instrument, a larger number of rectangular apertures may be provided, and they may be provided in both X and Y orientations. Rotated version of the same apertures 622-630 are shown also around the ring 606 with dotted outlines. Aperture 626', for example, is a rotated version of aperture 626. Which of these is for the X direction and which for the Y is a matter of the detailed design of the optical system, as well as labeling of the axes. For example, the range of sizes may include a square that is designed to give a field of view 3×3 µm, accompanied by further elongated apertures with FOV dimensions such as 0.3×4.5, 3×7.5, 3×12 µm. Narrower apertures may be provided, for example to give FOV dimension 1.5×10.5 µm, as well as wider rectangular apertures to give FOV dimensions such as 5.25×10.5 µm. Square apertures of different sizes may be provided also, for example as shown with dotted outline at 620'. It will be understood that, instead of a rotating wheel, interchangeable aperture plates may be provided, or a programmable aperture device (spatial light modulator) formed by a digital micro mirror device (DMD) or a liquid crystal device. Of course, the use of a reflective device such as a DMD or any reflective spot to define the illumination spot size and shape will imply a rearrangement of the optical system. "Aperture" should be understood as also including a suitable reflective spot, having the same effect as an aperture in the context of a re-arranged illumination system.

Figure 7:
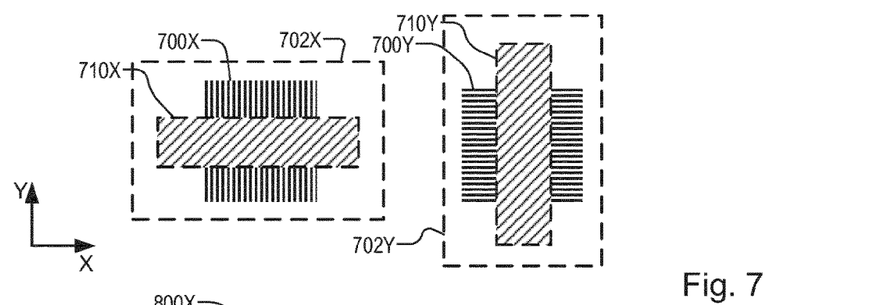
FIGS. 7 and 8 illustrate alternative designs of target grating and illumination spots that may be applied in embodiments of the present invention.
Figure 8:
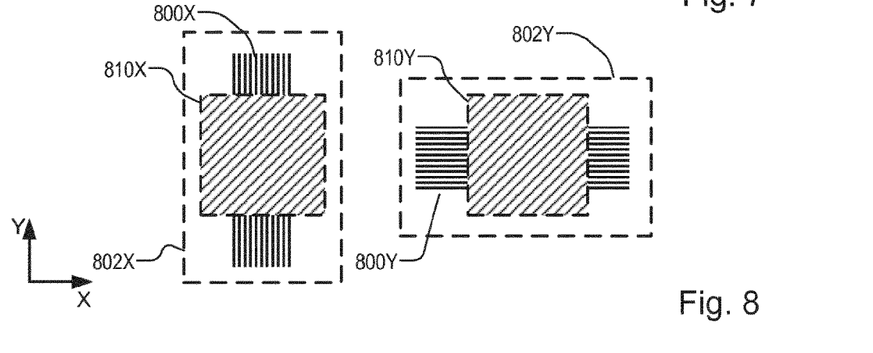

FIG. 7 and FIG. 8 illustrate further options for the design of targets with customized field of view, according to the principles described in relation to FIG. 3. Gratings 700X and 700Y are provided with periodicity in the X direction and Y direction, respectively exclusion areas 702X and 702Y are provided, before. Gratings 700X and 700Y are substantially square, in this example. Illumination spots 710X and 710Y are elongated in the direction of periodicity, and narrowed in the direction of the grating lines, so as to comply with the conditions set out above. The arrangement is similar to that shown in FIG. 3, except that the apertures are more rectangular. The dimensions of the sides of the square gratings 700X, 700Y might be, for example, 5 µm, while the rectangular illumination spots 710X, 710Y are for example 2.5 µm×10 µm. As a manufacture of semiconductor devices would like grating the area to be reduced to, for example 5×5 µm, it will be appreciated that the FOV will have a dimension less than 5 µm in one direction, for example less than 4 µm or even less than 3 µm.

Looking at FIG. 8, corresponding features are labelled in the same manner as FIG. 7, but with the first digit '8'. Notice that, whereas the example of FIG. 7 featured square gratings with elongated field of view, the example of FIG. 8 shows elongated gratings 800X, 800Y with a roughly or exactly square field of view 810X, 810Y. In this case, the gratings are elongated in the direction of the grating lines, that is transverse to their direction of periodicity. The field of view is substantially the same for both X and Y gratings, such that the same spot can be used for both X and Y gratings.

Numerous variations on the field of view and grating design can be envisaged. For example, where rectangular/square fields of view have been illustrated in FIGS. 7 and 8, oval and/or circular fields of view can be used. Curved outlines may be beneficial if they reduce diffraction effects within and around the aperture. (The strength of such effects depends on the relationship between aperture dimensions and radiation wavelength being used.)

The grating target may occupy less area as the grating of 5×5 μm in FIG. 7, but with dimensions 2.5×7.5 μm. In that case the FOV may for example have a dimension less than 3.5×5 μm in one direction. In all examples, the exclusion area should be larger than the extent of the field of view. A suitable exclusion are may be designed for example to provide a clear border of at least 1 μm around the grating. It will be understood that the border is more important in the direction of periodicity, in which the field of view by design extends beyond the grating.

Figure 9:
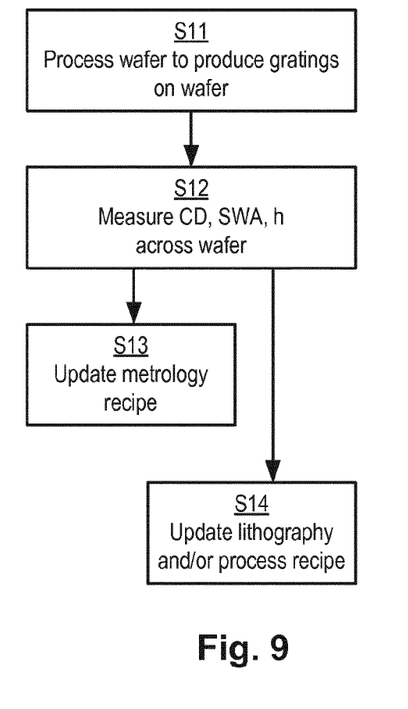
FIG. 9 illustrates a method of device manufacture incorporating measurement of parameters using the apparatus and methods of FIGS. 3 to 8.

FIG. 9 is a flowchart illustrating a manufacturing process in which measurements of the type described above are used as a basis for controlling metrology and/or production processes. In step S11, wafers (substrates) are processed to produce product features and metrology targets comprising gratings having small dimensions as described above. At step S12, diffraction patterns from of the gratings are detected with customized field of view, and properties of the gratings are calculated, all using the method of FIG. 5. The measured properties may for example be CD, SWA and height of the grating lines. At step S13, the measured properties are optionally used (together with other information as may be available), to update a metrology recipe so that measurements of future targets can be made more accurately and/or more quickly. The updated metrology recipe can be used for re-measurement of the same targets and wafers, and/or for measurement of targets on subsequently processed wafers. The updating process can be automated if desired.

As for the main purpose of the metrology process, the measured properties can also be used as an indicator for the quality of the lithographic steps and processing effects in general. In step S14, the knowledge of properties that is gained from step S12 is used to update recipes that control the lithographic patterning step and/or process steps in the device manufacturing process. The measurements may be used also to trigger for re-work of defective wafers, and/or to adjust parameters in the recipes for processing of further wafers. Again this updating can be automated if desired.

CONCLUSION

The techniques disclosed herein enable the design and use of smaller metrology targets to achieve reconstruction of parameters of interest other than overly. Greater quality control in high-volume manufacture is enabled.

Numerous variations and modifications are possible, in addition to the ones mentioned already above.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed. As already mentioned, coarse structural features, such as the lines and spaces of a grating, can be formed by collections of finer sub-structures.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the modified steps 506 and so calculate parameters of interest. The program may optionally be arranged to control the optical system, substrate support and the like to perform automatically the steps 504 etc. for measurement on a suitable plurality of target structures. A particular function of the control program will be to select the appropriate field stop (aperture 302) to define the customized field of view for each target. The appropriate field of view for each target can be indicated along with other parameters of the measurement process in a metrology recipe, received along with a substrate or a batch of substrates.

Further embodiments according to the invention are provided in below numbered clauses:

1. A method of measuring a property of structures on a substrate, said method comprising the steps:

(a) providing a substrate with a grating in which a plurality of structures are arranged periodically over an distance $g_P$ in a first direction, each structure individually extending a distance $g_L$ in a second direction transverse to the first direction, (b) illuminating said structure with a spot of radiation having a defined size and shape such that an extent $f_P$ of the spot in said first direction is greater than distance $g_P$ while an extent $f_L$ of the spot in said second direction is less than distance $g_L$;

(c) detecting a signal arising from interaction between said radiation and said structure within a field of view defined by said spot; and (d) calculating a measurement of said property based on the detected signal.

2. A method according to clause 1 wherein $g_L$ is two or more times $g_P$, or three or more times $g_P$.

3. A method according to clause 1 or 2 wherein $g_P$ is less than 6 μm.

4. A method according to any preceding clause wherein $f_P$ is two or more times $f_L$, or three or more times $f_L$.

5. A method according to any preceding clause wherein $f_L$ is less than 4 μm.

6. A method according to any preceding clause wherein the steps (a) to (d) are repeated for a plurality of gratings on the same substrate, and wherein the orientation of the first and second directions is different for different ones of said gratings.

7. A method according to clause 6 wherein the size and shape of the spot is unchanged for the different orientations.

8. A method according to any preceding clause wherein the size and shape of said spot is defined by an adjustable field stop in an illumination optical system.

9. A method according to any preceding clause wherein said step (d) comprises:

(d1) defining a mathematical model in which shape and material properties of said structure, are represented by a plurality of parameters including at least one parameter of interest;

(d2) calculating a plurality of model signals by simulating interaction between said radiation and said mathematical model while varying the parameter or parameters of interest;

(d3) calculating degrees of matching between the detected signal and at least some of the model signals calculated in step (d2); and (d4) reporting a measurement of said parameter of interest based on the calculated degrees of matching.

10. A method according to clause 9 wherein the steps (d2) and (d3) are performed in an iterative loop to find a value of the parameter of interest by regression.

11. A method according to clause 9 or 10 wherein said model signals are calculated with regard to two dimensions only, with the assumption that the structure in the second direction is infinite.

12. A method according to any preceding clause wherein said detected signal is a two-dimensional diffraction pattern obtained by angle-resolved scatterometry.

13. An inspection apparatus for measuring a property of structures on a substrate, the apparatus comprising:

a support for a substrate having a target structure formed thereon;

an optical system for illuminating the target structure with a spot of radiation and detecting a signal arising from interaction between said radiation and said target structure;

a processor arranged to calculate a measurement of said property based on said detected signal, wherein said processor is arrange to calculate said measurement on the assumption that said target structure comprises a grating in which a plurality of structures are arranged periodically over an distance $g_P$ in a first direction, each structure individually extending a distance $g_L$ in a second direction transverse to the first direction, and wherein said optical system is operable to illuminate define the shape and size of said spot of radiation such that an extent $f_P$ of the spot in said first direction is greater than distance $g_P$ while an extent $f_L$ of the spot in said second direction is less than distance $g_L$.

14. An apparatus according to clause 13 arranged such that $g_L$ is two or more times $g_P$, or three or more times $g_P$.

15. An apparatus according to clause 13 or 14 arranged such that $g_P$ is less than 6 μm.

16. An apparatus according to any of clauses 13 to 15 wherein $f_P$ can be set to be two or more times $f_L$.

17. An apparatus according to any of clauses 13 to 16 wherein $f_L$ can be set to be less than 4 μm.

18. An apparatus according to any of clauses 13 to 17 wherein the apparatus is arranged automatically to repeat said illumination, detection and calculation for a plurality of gratings on the same substrate, and wherein the orientation of the first and second directions is different for different ones of said gratings.

19. An apparatus according to clause 18 operable to use the size and shape of spot for gratings of different orientations.

20. An apparatus according to any of clauses 13 to 19 wherein the size and shape of said spot is defined by an adjustable field stop in said optical system.

21. An apparatus according to any of clauses 13 to 20 wherein said processor is arranged to calculate said measurement of said property by:

defining a mathematical model in which shape and material properties of said structure, are represented by a plurality of parameters including at least one parameter of interest;

calculating a plurality of model signals by simulating interaction between said radiation and said mathematical model while varying the parameter or parameters of interest;

calculating degrees of matching between the detected signal and at least some of the calculated model signals; and reporting a measurement of said parameter of interest based on the calculated degrees of matching.

22. An apparatus according to clause 21 arranged to perform said calculating steps in an iterative loop to find a value of the parameter of interest by regression.

23. An apparatus according to clause 21 or 22 wherein said model signals are calculated with regard to two dimensions only, with the assumption that the structure in the second direction is infinite.

24. An apparatus according to any of clauses 13 to 23 wherein said detected signal is a two-dimensional diffraction pattern obtained by angle-resolved scatterometry.

25. A computer program product comprising machine-readable instructions for causing a processor to perform the step (d) of a method according to any of clauses 1 to 12.

26. A computer program product according to clause 25 further comprising instructions for causing a processor to control an inspection apparatus to perform the steps (b) and (c) of the method for a plurality of gratings.

27. A lithographic system comprising:

a lithographic apparatus arranged to transfer a sequence of patterns from patterning devices onto a substrate; and an inspection apparatus according to any of clauses 13 to 24 arranged to measure a property of the patterns transferred by the lithographic apparatus.

28. A lithographic system according to clause 27 be arranged to control the lithographic apparatus to apply corrections in response to measurements made using the inspection apparatus on a previous substrate.

29. A method of manufacturing devices wherein a sequence of device patterns is applied to a series of substrates using a lithographic process, the method including measuring a property of metrology gratings formed as part of or beside said device patterns on at least one of said substrates using a measuring method according to any of clauses 1 to 12, wherein the lithographic process for one or more substrates is controlled in response to the property measured on one or more previous substrates.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a property of structures on a substrate, the method comprising the steps:
   (a) providing a substrate with a grating in which a plurality of structures are arranged periodically over a distance gP in a first direction, each structure individually extending a distance gL in a second direction transverse to the first direction;
   (b) illuminating the structure with a spot of radiation having a defined size and shape such that an extent fP of the spot in the first direction is greater than distance gP while an extent fL of the spot in the second direction is less than distance gL;
   (c) detecting a signal arising from interaction between the radiation and the structure within a field of view defined by the spot; and
   (d) calculating a measurement of the property based on the detected signal,
   wherein gL is less than 12 µm,
   wherein fP is two or more times fL, and
   wherein illuminating and detecting are conducted in a vertically aligned inspection apparatus.

2. The method as claimed in claim 1, wherein gL is two or more times gP, or three or more times gP.

3. The method as claimed in claim 1, wherein gP is less than 6 µm.

4. The method as claimed in claim 1, wherein fP is three or more times fL.

5. The method as claimed in claim 1, wherein fL is less than 4 µm.

6. The method as claimed in claim 1, wherein the step (d) comprises:

(d1) defining a mathematical model in which shape and material properties of the structure, are represented by a plurality of parameters including at least one parameter of interest;
   (d2) calculating a plurality of model signals by simulating interaction between the radiation and the mathematical model while varying the parameter or parameters of interest;
   (d3) calculating degrees of matching between the detected signal and at least some of the model signals calculated in step (d2); and
   (d4) reporting a measurement of the parameter of interest based on the calculated degrees of matching.

7. The method as claimed in claim 6, wherein the model signals are calculated with regard to two dimensions only, with the assumption that the structure in the second direction is infinite.

8. The method as claimed in any preceding claim 1, wherein the detected signal is a two-dimensional diffraction pattern obtained by angle-resolved scatterometry.

9. An inspection apparatus for measuring a property of structures on a substrate, the apparatus comprising:
   a support for a substrate having a target structure formed thereon;
   an optical system for illuminating the target structure with a spot of radiation and detecting a signal arising from interaction between the radiation and the target structure;
   a processor arranged to calculate a measurement of the property based on the detected signal,
   wherein the processor is arranged to calculate the measurement on the assumption that the target structure comprises a grating in which a plurality of structures are arranged periodically over a distance gP in a first direction, each structure individually extending a distance gL in a second direction transverse to the first direction,
   wherein the optical system is operable to illuminate and define the shape and size of the spot of radiation such that an extent fP of the spot in the first direction is greater than distance gP while an extent fL of the spot in the second direction is less than distance gL,
   wherein gL is less than 12 µm,
   wherein fP is two or more times fL, and
   wherein the inspection apparatus is vertically aligned.

10. The apparatus as claimed in claim 9, arranged such that gL is two or more times gP, or three or more times gP.

11. The apparatus as claimed in claim 9, arranged such that gP is less than 6 µm.

12. The apparatus as claimed in claim 9, wherein fP can be set to be three or more times fL.

13. The apparatus as claimed in claim 9, wherein fL can be set to be less than 4 µm.

14. The apparatus as claimed in claim 9, wherein the processor is arranged to calculate the measurement of the property by:
   defining a mathematical model in which shape and material properties of the structure are represented by a plurality of parameters including at least one parameter of interest;
   calculating a plurality of model signals by simulating interaction between the radiation and the mathematical model while varying the parameter or parameters of interest;
   calculating degrees of matching between the detected signal and at least some of the calculated model signals; and reporting a measurement of the parameter of interest based on the calculated degrees of matching.

15. The apparatus as claimed in claim 14, wherein the model signals are calculated with regard to two dimensions only, with the assumption that the structure in the second direction is infinite.

16. The apparatus as claimed in claim 9, wherein the detected signal is a two-dimensional diffraction pattern obtained by angle-resolved scatterometry.

17. A non-transitory computer program medium containing one or more sequences of machine-readable instructions for calculating electromagnetic scattering properties of a structure, the instructions being adapted to cause one or more processors to perform a method comprising:
  providing a substrate with a grating in which a plurality of structures are arranged periodically over a distance gP in a first direction, each structure individually extending a distance gL in a second direction transverse to the first direction;
  illuminating the structure with a spot of radiation having a defined size and shape such that an extent fP of the spot in the first direction is greater than distance gP while an extent fL of the spot in the second direction is less than distance gL;
  detecting a signal arising from interaction between the radiation and the structure within a field of view defined by the spot; and
  calculating a measurement of the property based on the detected signal,
  wherein gL is less than 12 μm,
  wherein fP is two or more times fL, and
  wherein illuminating and detecting are conducted in a vertically aligned inspection apparatus.

18. A lithographic system comprising:
  a lithographic apparatus arranged to transfer a sequence of patterns from patterning devices onto a substrate; and
  an inspection apparatus arranged to measure a property of the patterns transferred by the lithographic apparatus, the inspection apparatus comprising:
    a support for the substrate having a target structure formed thereon;
    an optical system configured to illuminate the target structure with a spot of radiation and detecting a signal arising from interaction between the radiation and the target structure; and
    a processor arranged to calculate a measurement of the property based on the detected signal,
  wherein the processor is arranged to calculate the measurement on the assumption that the target structure comprises a grating in which a plurality of structures are arranged periodically over a distance gP in a first direction, each structure individually extending a distance gL in a second direction transverse to the first direction,
  wherein the optical system is operable to illuminate and define the shape and size of the spot of radiation such that an extent fP of the spot in the first direction is greater than distance gP while an extent fL of the spot in the second direction is less than distance gL,
  wherein gL is less than 12 μm,
  wherein fP is two or more times fL, and
  wherein the inspection apparatus is vertically aligned.

19. A method of manufacturing devices wherein a sequence of device patterns is applied to a series of substrates using a lithographic process, the method comprising:
  measuring a property of metrology gratings formed as part of or beside the device patterns on at least one of the substrates using a measuring method comprising:
    providing a substrate with a grating in which a plurality of structures are arranged periodically over a distance gP in a first direction, each structure individually extending a distance gL in a second direction transverse to the first direction;
    illuminating the structure with a spot of radiation having a defined size and shape such that an extent fP of the spot in the first direction is greater than distance gP while an extent fL of the spot in the second direction is less than distance gL;
    detecting a signal arising from interaction between the radiation and the structure within a field of view defined by the spot; and
    calculating a measurement of the property based on the detected signal; and
  controlling the lithographic process for one or more substrates in response to the property measured on one or more previous substrates,
  wherein gL is less than 12 μm,
  wherein fP is two or more times fL, and
  wherein illuminating and detecting are conducted in a vertically aligned inspection apparatus.

* * * * *